US012656677B2

(12) United States Patent
Chen et al.

(10) Patent No.: US 12,656,677 B2
(45) Date of Patent: Jun. 16, 2026

(54) SYSTEMS AND METHODS FOR ACTINIC MASK INSPECTION AND REVIEW IN VACUUM

(71) Applicant: Taiwan Semiconductor Manufacturing Company, Hsinchu (TW)

(72) Inventors: Chien-Lin Chen, Tainan (TW); Danping Peng, Fremont, CA (US); Chih-Chiang Tu, Tauyen (TW); Chih-Wei Wen, Tainan (TW); Hsin-Fu Tseng, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 695 days.

(21) Appl. No.: 18/093,106

(22) Filed: Jan. 4, 2023

(65) Prior Publication Data

US 2024/0003827 A1      Jan. 4, 2024

Related U.S. Application Data

(60) Provisional application No. 63/429,417, filed on Dec. 1, 2022, provisional application No. 63/357,531, filed on Jun. 30, 2022.

(51) Int. Cl.
*G03F 1/84* (2012.01)

(52) U.S. Cl.
CPC ..................................... *G03F 1/84* (2013.01)

(58) Field of Classification Search
CPC .... G03F 7/70841; G03F 7/70666; G03F 1/84; G03F 1/24; G03F 7/70725;
(Continued)

(56) References Cited

U.S. PATENT DOCUMENTS

| | | | |
|---|---|---|---|
| 6,522,717 B1 * | 2/2003 | Murakami | ............... G21K 7/00 |
| | | | 430/5 |
| 7,196,771 B2 | 3/2007 | Berger | |

(Continued)

FOREIGN PATENT DOCUMENTS

| | | | |
|---|---|---|---|
| JP | 2014153326 A | * | 8/2014 |
| TW | 519574 B | | 2/2003 |
| TW | 202211299 A | | 3/2022 |

OTHER PUBLICATIONS

Machine translation of JP-2014153326-A (Year: 2014).*
Taiwan Office Action for Application No. 11320541740, Dated May 30, 2024.

*Primary Examiner* — Steven H Whitesell
(74) *Attorney, Agent, or Firm* — Lippes Mathias LLP

(57) ABSTRACT

In a mask review method, a vacuum is drawn in a vacuum chamber that contains an extreme ultraviolet (EUV) actinic mask review system including an EUV illuminator, a mask stage, a projection optics box, and an EUV imaging sensor. With the vacuum drawn, a position is adjusted of at least one component of the EUV actinic mask review system. After the adjusting and with the vacuum drawn, an actinic image is acquired of an EUV mask mounted on the mask stage using the EUV imaging sensor. The acquiring includes transmitting EUV light from the EUV illuminator onto the EUV mask and projecting at least a portion of the EUV light reflected by the EUV mask onto the EUV imaging sensor using the projection optics box.

20 Claims, 12 Drawing Sheets

(58) Field of Classification Search
CPC ............. G03F 7/70758; G01N 21/956; G01N
21/8806; G01N 2021/95676; G01N
2021/8411
See application file for complete search history.

(56) References Cited

U.S. PATENT DOCUMENTS

| | | | |
|---|---|---|---|
| 2002/0180946 A1* | 12/2002 | Bisschops | G03F 7/70716 |
| | | | 355/75 |
| 2003/0067598 A1* | 4/2003 | Tomie | G01N 21/95623 |
| | | | 356/237.2 |
| 2006/0054836 A1* | 3/2006 | Tezuka | G01N 21/9505 |
| | | | 250/372 |
| 2007/0158636 A1* | 7/2007 | Tezuka | G01N 21/4788 |
| | | | 430/4 |
| 2010/0315612 A1* | 12/2010 | De Boeij | G03B 27/54 |
| | | | 355/77 |
| 2011/0043811 A1* | 2/2011 | Yamane | G01N 21/956 |
| | | | 356/237.5 |
| 2012/0162755 A1* | 6/2012 | Stroessner | G03F 1/84 |
| | | | 359/385 |
| 2013/0038850 A1* | 2/2013 | Feldmann | G01N 21/956 |
| | | | 355/67 |
| 2017/0336716 A1* | 11/2017 | Flagello | G03F 7/70033 |
| 2018/0276812 A1* | 9/2018 | Kohyama | G06T 7/0008 |
| 2020/0225574 A1* | 7/2020 | Kvamme | G03F 1/84 |
| 2021/0003925 A1 | 1/2021 | Holderer et al. | |
| 2021/0247323 A1* | 8/2021 | Takehisa | G01N 21/8806 |
| 2022/0065797 A1* | 3/2022 | Terasawa | G01N 21/8806 |
| 2022/0101569 A1* | 3/2022 | Dietzel | G03F 1/84 |
| 2022/0390320 A1* | 12/2022 | Koch | G01M 11/0207 |
| 2024/0361704 A1* | 10/2024 | Gwosch | G03F 7/70625 |
| 2024/0402613 A1* | 12/2024 | Winkler | G03F 7/70133 |

* cited by examiner

EUV scanner SRC

Fit hexagonal grid

Intensity vs R

Determine maximum intensity
to fit hole size

SMO aperture

30

M3

34

Type C actuators

M3

Type A actuator

M4

Type C actuators

84

34

Type B
actuator

86

88

Type B
actuator

Type A actuator

Type B
actuator

M1

34

M2

Type A actuator

SYSTEMS AND METHODS FOR ACTINIC MASK INSPECTION AND REVIEW IN VACUUM

This application claims the benefit of U.S. Provisional Application No. 63/357,531 filed Jun. 30, 2022 and titled "SYSTEMS AND METHODS FOR ACTINIC MASK INSPECTION AND REVIEW IN VACUUM", which is incorporated herein by reference in its entirety. This application also claims the benefit of U.S. Provisional Application No. 63/429,417 filed Dec. 1, 2022 and titled "SYSTEMS AND METHODS FOR ACTINIC MASK INSPECTION AND REVIEW IN VACUUM", which is incorporated herein by reference in its entirety.

BACKGROUND

The following relates to the photolithography arts, photolithographic mask inspection arts, extreme ultraviolet (EUV) photolithography arts, EUV photolithographic mask inspection arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
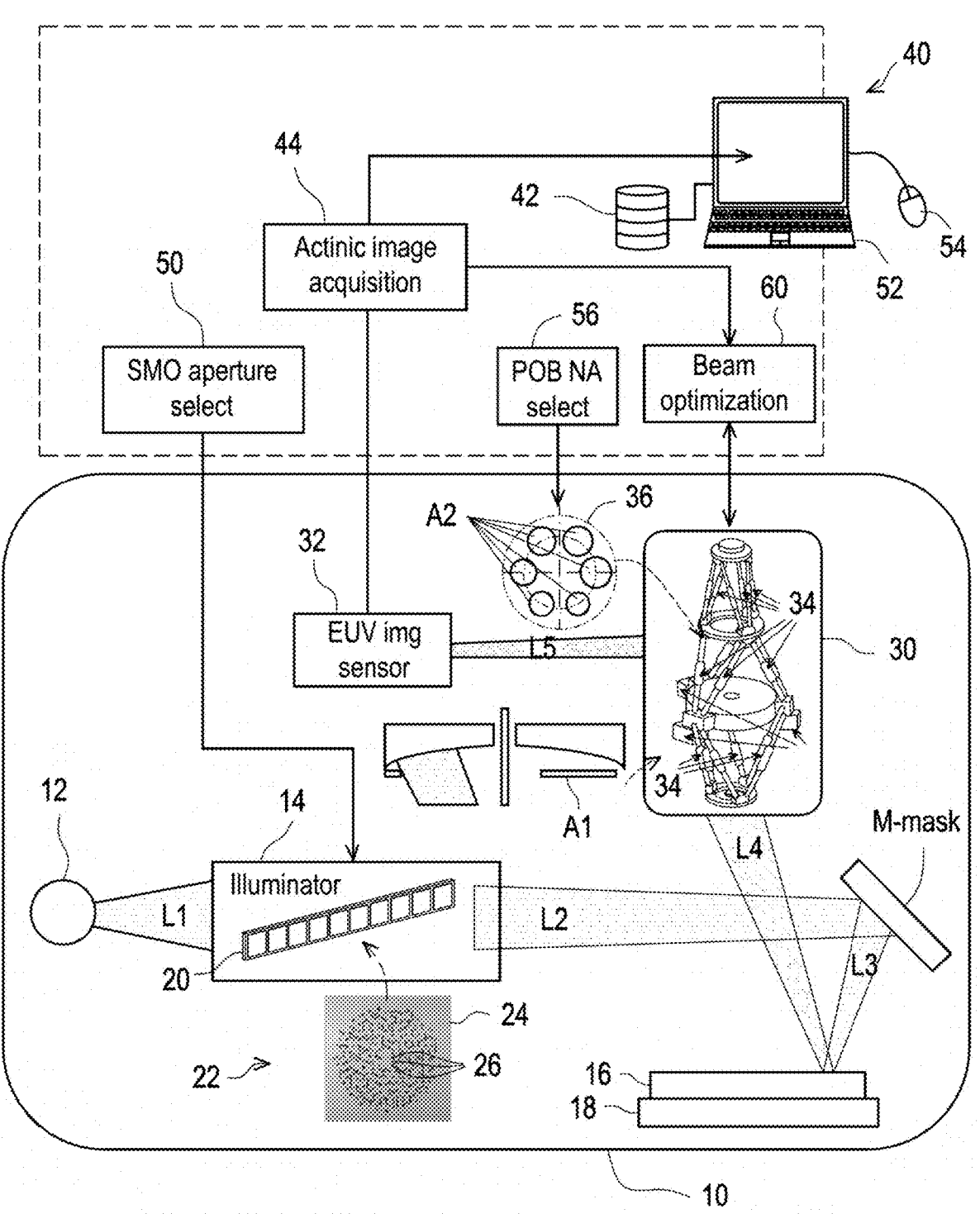
FIG. 1 diagrammatically illustrates an actinic EUV mask inspection system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography is used in integrated circuit (IC) fabrication processes with critical dimension (CD) sizes that can as small as 10 nm or less. EUV light is typically considered to be ultraviolet light in the free space wavelength range of 124 nm to 10 nm. As one nonlimiting illustrative example, EUV lithography using EUV light at 13.5 nm wavelength is used commercially to photolithographically define IC features of, for example, 5 nm CD size. To achieve sub-wavelength sized features (i.e., features whose CD is smaller than the wavelength of light used in the lithography), various techniques can be used such as inclusion of sub-resolution assist features (SRAFs) in the mask design. In designing complex masks with small CD, a technique known as source-mask optimization (SMO) can be used. In this approach, the illumination aperture and the mask are optimized together, so that the output of the SMO includes both an optimized mask design and a corresponding optimized EUV illumination aperture. In use, the EUV lithography scanner is configured to illuminate the optimized mask with the optimized EUV illumination aperture so as to produce the desired latent image in photoresist coating the semiconductor wafer.

Damage or contamination of the mask, for example by a particulate adhering to the mask surface, can transfer to the latent image printed on the photoresist thereby resulting in a defect that can adversely impact device yield or require scrapping of the wafer. On the other hand, the particulate may not actually print depending on the size, location, and other characteristics of the particulate. To make such an assessment, actinic mask inspection is employed. Actinic inspection of a mask entails inspecting the mask with the same wavelength of light that the lithography system uses when the mask is employed in photolithography. For example, if the mask is used in EUV lithography employing 13.5 nm EUV light, then actinic inspection of the mask is done using EUV light at 13.5 nm. Moreover, if the mask was designed by SMO, then the corresponding optimized EUV light aperture should be used in the mask inspection. By way of actinic mask inspection, it can be determined, for example, whether or not a defect on the mask will actually transfer to and print in the photoresist. One way to perform actinic mask inspection is to perform a test EUV lithography run using the EUV lithography scanner and then examining the latent image produced in photoresist coating a test wafer. However, this approach for actinic mask inspection takes time as the photoresist is developed and then inspected. Also, such an actinic mask inspection using the EUV lithography scanner occupies valuable time on the EUV lithography scanner.

In embodiments disclosed herein, a dedicated EUV actinic mask review system is provided that includes a mask stage configured to mount an EUV mask, an EUV illuminator arranged to transmit EUV light onto the EUV mask mounted on the mask stage, an EUV imaging sensor, and a projection optics box configured to project at least a portion of the EUV light reflected by the associated EUV mask mounted on the mask stage onto the EUV imaging sensor. The EUV illuminator, the mask stage, the EUV imaging sensor, and the projection optics box are contained in a vacuum chamber, and in various embodiments various adjustments of the actinic mask inspection system are operable from outside of the vacuum chamber, so that the adjustments can be made with vacuum drawn in the vacuum chamber. In this context, the drawn vacuum places the interior of the vacuum chamber at a pressure which is below atmospheric pressure (1 atm=760 Torr=101 kPa). The vacuum that is drawn should be sufficiently low to enable EUV light to pass through the evacuated ambient inside the vacuum chamber without unacceptable attenuation due to passage through the evacuated ambient. In some nonlimiting illustrative embodiments, the drawn pressure in the vacuum chamber is around 750 mTorr (=100 Pa) or lower, although this is merely a nonlimiting illustrative example. It is to be understood that drawing the vacuum may entail continuous pumping using a suitable vacuum pump or combination of vacuum pumps to counteract outgassing from surfaces or other gas influx. It is also contemplated that the drawn vacuum may be maintained in the presence of a flow of hydrogen or another working gas into the vacuum chamber to create a desired ambient composition at the drawn vacuum pressure. The ability to make various adjustments of the actinic mask inspection system while the vacuum chamber is under vacuum facilitates performing complex actinic mask inspection with settings that closely mimic the EUV lithography scanner, such as setting a projection optics box of the system to have a numerical aperture (NA) matching the design-basis NA for the mask. In the case of a mask designed by SMO, various embodiments of the EUV actinic mask review system are designed to provide the appropriate SMO-optimized EUV light aperture, and in some embodiments to switch between different EUV light apertures. A further benefit is that the EUV imaging sensor provides an aerial image of the photomask which can be viewed directly and immediately examined using image display manipulation techniques such as zoom and pan to assess the mask, without involvement of intervening exposed photoresist development and inspection processing.

With reference to FIG. 1, an illustrative dedicated EUV actinic mask review system is shown. This system includes a vacuum chamber 10 containing an EUV light source 12 emitting EUV light L1 to an EUV illuminator 14 that may process the light by operations such as focusing and/or shaping the light aperture to produce light L2. The EUV illuminator 14 is arranged (by way of a mirror M-mask in the illustrative example) to transmit the EUV light L3 onto an EUV mask 16 mounted on mask stage 18. EUV light is typically considered to be ultraviolet light in a spectral range of 124 nm to nm (for example, 13.5 nm which is a commonly used wavelength in commercial EUV lithography scanners); however, as used herein the EUV light L1, L2, L3 can have a wavelength that may encompass shorter wavelengths, such as 6.7 nm beyond EUV (BEUV) light, to the extent such shorter wavelength EUV light (e.g. 6.7 nm light) is used in photolithographic processing for IC manufacturing. The EUV light source 12 outputting the EUV light L1 may, by way of nonlimiting illustrative example, comprise a laser-produced plasma (LPP) EUV light source, e.g. using tin droplets, or a laser-assisted discharge produced plasma (LDP) EUV light source, or so forth. The EUV illuminator 14 may optionally include an arrangement of mirrors (not shown) forming an optical train which focuses, directs, or otherwise processes the EUV light to form the output light L2. In some embodiments, the EUV illuminator 14 includes a slider 20 carrying a plurality of EUV light shaping apertures (with one illustrative light shaping aperture 22 shown in enlarged plan view by way of illustrative example). Each EUV light shaping aperture 22 includes a plate 24 having through-holes 26 passing through the plate. As will be described later herein, the through-holes 26 may in some embodiments be designed to provide an EUV aperture that forms the light L2 to match the SMO-optimized aperture corresponding to the mask 16 undergoing inspection. The slider 20 enables switching between light-shaping apertures while the vacuum chamber 10 is under vacuum, thus facilitating inspection of a mask (or multiple masks) without venting the vacuum chamber to atmosphere to exchange light shaping apertures.

The mask stage 18 can be any structure capable of receiving and mounting the mask 16 in a fixed position for inspecting the mask 16. For example, the mask stage 18 may include a vacuum chuck, electrostatic chuck, or the like for securing the mask 16 to the mask stage 18. Although not shown, it is also contemplated for the mask stage 18 and/or ancillary hardware to be configured to enable switching between different masks while keeping the vacuum chamber 10 under vacuum. For example, a robotic loading/unloading mechanism (not shown) is contemplated for transporting a selected mask from a mask storage elevator, mask carrier or pod, or the like to the mask stage 18 and placing the transported mask onto the wafer stage 18. In this way, multiple masks can be inspected in succession without breaking vacuum of the vacuum chamber 10. If these masks are different SMO-optimized masks, then each mask can be inspected in turn using its corresponding SMO-optimized EUV light aperture by operating the slider 20 of the illuminator 14 to provide the appropriate EUV light aperture.

With continuing reference to FIG. 1, the illustrative EUV actinic mask review system further includes a projection optics box (POB) 30 disposed inside the vacuum chamber 10. The POB 30 is configured to project at least a portion of the EUV light L4 reflected by the EUV mask 16 mounted on the mask stage 18 as projected light L5 that is projected by the POB 30 onto an EUV imaging sensor 32 of the EUV actinic mask review system which is also disposed inside the vacuum chamber 10. FIG. 1 illustrates a diagrammatic representation of the POB 30. In some embodiments, the POB 30 includes a set of mirrors and a set of actuators 34 which enable adjusting a position of at least one mirror of the set of mirrors using the set of actuators 34 to optimize the beam output from the POB 30 to the EUV imaging sensor 32. The illustrative POB 30 further includes a first aperture A1 which is diagrammatically shown in enlarged side sectional view in FIG. 1, and a slider or carousel which carries a plurality of (second) apertures A2 which can be selectively inserted into the optical path of the POB 30 to set a numerical aperture (NA) of the POB 30 to a value determined by the selected aperture. FIG. 1 diagrammatically shows an enlarged top view of an illustrative carousel 36 carrying a set of six selectable second (i.e., POB NA-selection) apertures A2. As will be described further herein, the first aperture A1 is in some embodiments designed to enhance EUV light collection, while the set of selectable second apertures A2 provide for setting the POB 30 to a chosen numerical aperture. The EUV imaging sensor 32 can be any imaging sensor array that is sensitive to the EUV light L5, such as a charge-coupled device (CCD) imaging array, a time delay integration (TDI) imaging array, or so forth.

In the illustrative example of FIG. 1, the vacuum chamber 10 contains the EUV light source 12, the EUV illuminator 14, the mask stage 18, the POB 30, and the EUV imaging sensor 32. In a variant embodiment (not shown), the EUV light source 12 may be located outside of the vacuum chamber 10 and connected therewith by a suitable evacuated EUV light port or the like. For example, in embodiments in which the EUV light source 12 is a laser-produced plasma (LPP) light source, the LPP light source may be contained in a separate LPP light source vacuum chamber that is connected with the vacuum chamber 10 containing the EUV illuminator 14, the mask stage 18, the POB 30, and the EUV imaging sensor 32 by way of an EUV light coupling tube located at about the intermediate focus (IF) of the EUV light beam produced by the LPP light source.

With continuing reference to FIG. 1, the illustrative EUV actinic mask review system is configured to enable adjusting a position of at least one component of the EUV actinic mask review system with vacuum drawn on the vacuum chamber 10. Thus, the adjustment of the position of the at least one component can be done without venting the vacuum chamber 10 to atmosphere to open it to make the adjustment. For example, the adjustment of the position of the at least one component can include one or more of: (i) adjusting the slider 20 to place a selected light shaping aperture into the optical path; and/or (ii) adjusting a position of at least one mirror of the set of mirrors of the POB 30 using the set of actuators 34 of the POB 30; and/or (iii) operating the slider or carousel 36 to insert a selected aperture A2 of the plurality of apertures into an optical path of the POB 30 to set a numerical aperture (NA) of the POB 30 to a value determined by the selected aperture A2.

To provide such adjustment(s) in an automated or semi-automated fashion, in illustrative FIG. 1 the EUV actinic mask review system further includes or is operatively connected with an illustrative computer or other electronic processing device that provides control functionality. The computer or other electronic processing device may be a desktop computer, a notebook computer, a tablet computer, a server computer, various combinations thereof, or the like. Alternatively, the computer or other electronic processing device 40 may be a custom-built computing device based on a microprocessor or microcontroller. To connect the computer or other electronic processing device 40 with the various controllable components of the EUV actinic mask review system, suitable electrical (or pneumatic, hydraulic, or other type of) feedthroughs can be provided in the vacuum chamber 10 or at suitable vacuum chamber ports secured therewith (features not shown).

The computer or other electronic processing device 40 includes or is operatively connected with a non-transitory storage medium 42 that stores instructions readable and executable by the computer or other electronic processing device 40 to cause the computer or other electronic processing device 40 to perform the disclosed control functions. For example, the computer or other electronic processing device 40 is suitably programmed to perform an actinic image acquisition process 44 in which an actinic image of the mask 16 undergoing inspection is acquired the EUV imaging sensor 32. The actinic image acquisition process 44 may optionally perform image preprocessing operations such as cropping the actinic image, colorizing the actinic image, and/or so forth, and may further display the (optionally preprocessed) actinic image on a display 46 included with or operatively connected with the computer or other electronic processing device 40.

As another example, the computer or other electronic processing device 40 may be programmed to perform an SMO aperture selection process 50 in which a user input received from a keyboard 52, mouse, 54 or other user input device included with or operatively connected with the computer or other electronic processing device 40 selects an aperture carried by the slider 20, and the computer or other electronic processing device 40 sends an electrical actuation signal to the slider 20 to cause the slider to slide the selected light shaping aperture into the optical path. (Instead of an electrical actuation signal, a pneumatic or hydraulic actuation signal could be used, or a wireless electrical actuation signal could be used). To this end, the slider 20 suitably include or is operatively connected with a sealed vacuum-compatible motor or other motive mechanism controlled by the actuation signal for moving the slider 20. In a variant embodiment, rather than receiving the control signal from a user input device 52, 54, the SMO aperture select process 50 may execute a preprogrammed recipe in a predetermined sequence of apertures are successively inserted into the optical path to perform a succession of different mask inspection processes with the different light shaping apertures. In some embodiments, the SMO aperture select process 50 may operate in conjunction with a corresponding mask select process (not shown) the controls a robotic mask loader/unloader or the like to successively load different masks for inspection onto the mask stage 18. For example, the predetermined sequence of apertures may be a predetermined sequence of SMO apertures corresponding to a predetermined sequence of SMO-optimized masks undergoing inspection.

As another example, the computer or other electronic processing device 40 may be programmed to perform a POB numerical aperture (NA) selection process 56 in which a user input or preprogrammed recipe specifies a NA for the POB 30 and the computer or other electronic processing device 40 sends an actuation signal to the slider or carousel 36 to cause the slider or carousel 36 to insert an appropriate second aperture A2 into the optical path of the POB 30 to set the POB 30 to the specified NA. This POB NA selection could be done on combination with the SMO aperture select process 50 and a mask loading process to implement the aforementioned predetermined sequence of SMO-optimized mask inspections using the POB NA appropriate for each mask.

As yet another example, the computer or other electronic processing device 40 may be programmed to perform a beam optimization process 60 by adjusting a position of at least one mirror of the set of mirrors of the POB 30 using the set of actuators 34 of the POB 30. In this case, the adjustments can be complex, since the set of mirrors may include several mirrors (e.g., four mirrors in some examples presented herein) with potentially multiple actuators 34 for adjusting each mirror (or, in some examples herein, where a single actuator 34 may adjust a strut connecting two mirrors so that single adjustment moves both mirrors). Accordingly, it is contemplated for the beam optimization process 60 to comprise an automated feedback-controlled process. In one approach, the EUV light L2 is transmitted from the EUV illuminator 14 onto the EUV mask 16 (or, in another example, onto an EUV mirror mounted on the mask stage 18) and projecting at least a portion of the EUV light L4 reflected by the EUV mask or EUV mirror onto the EUV imaging sensor 32 using the POB 30 and measuring a beam shape using the EUV imaging sensor 32. This provides the feedback for performing feedback control of the beam optimization 60 in adjusting of the position of the at least one mirror based on the measured beam shape. In this feedback-controlled process, the use of a flat EUV mirror mounted on mask stage 18 instead of a mask may be useful since the acquired image is therefore of the beam without modulation by a mask pattern. However, if the mask pattern is at least approximately known, or if the mask is mostly reflective, then the modulation of the measured beam shape by the mask may be either accounted for or neglected, so that the beam optimization can be performed using a mask.

The illustrative EUV actinic mask review system described with reference to FIG. 1 includes numerous features that facilitate rapid and effective mask review, such as the slider 20 carrying the plurality of EUV light shaping apertures 22, the actuators 34 for adjusting the POB 30, the light-collecting aperture A1, and the NA-selecting slider or carousel 36 carrying the plurality of NA selection apertures A2. It will be appreciated that these various features can be used together, as shown, or a subset of one or more of these features may be used without the others while still obtaining substantial benefit of the one or more features that are used.

Having provided an overview of an illustrative EUV actinic mask review system with reference to FIG. 1, in the following various features and aspects of various embodiments of EUV actinic mask review system and/or aspects thereof are described and in greater detail.

Figure 2A:
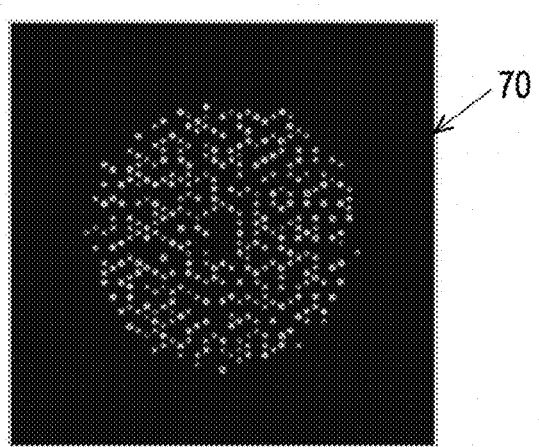
FIGS. 2A, 2B, 2C, 2D, and 2D diagrammatically illustrate a process for designing and manufacturing a source-mask optimization (SMO) aperture for use in the actinic EUV mask inspection system of FIG. 1, including: "EUV scanner SRC" (FIG. 2A); "Fit hexagonal grid" (FIG. 2B); "Intensity vs R" (FIG. 2C); "Determine maximum intensity to fit hole size (FIG. 2D); and "SMO aperture" (FIG. 2E).
Figure 2B:
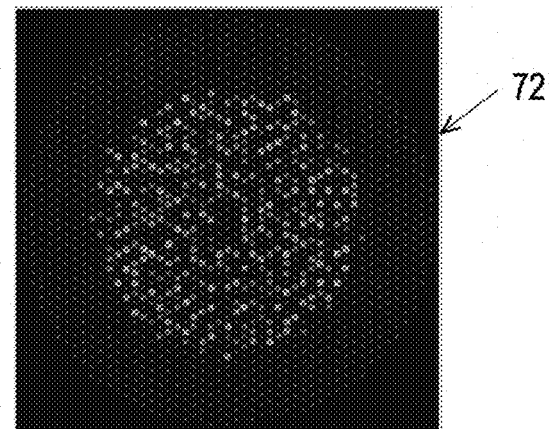

With reference to FIGS. 2(A)-(E) and FIGS. 3-4, an approach for manufacturing an embodiment of the EUV light shaping aperture 22 of FIG. 1 is described. The disclosed approach manufactures the EUV light shaping aperture 22 to shape the EUV light L1 to produce the light L2 having an SMO aperture that is co-designed with the mask 16 using source-mask optimization (SMO). In FIG. 2(A), the EUV light aperture 70 may be stored as an EUV scanner source (src) file in a standard format consumable by the controller of a commercial EUV lithography scanner, for example. As seen in FIG. 2(A), the EUV light aperture includes light intensity that varies in intensity over the two-dimensional cross-section of the EUV light beam. That light intensity distribution has been co-designed with the pattern of the mask 16 using SMO to provide a designed latent image printed on photoresist of a wafer during photolithography. In a first manufacturing step, the light intensity distribution of the EUV light aperture 70 is fitted to a grid to from a fitted hexagonal grid of intensity points, as seen in FIG. 2(B). The illustrative example employs a hexagonal grid; however, a Cartesian grid or other type of grid could also be used. In the fitting, each point on the grid is assigned a light intensity corresponding to the light intensity of the EUV light aperture 70 at the location of that point. Hence, the grid fitting process can be seen as a two-dimensional spatial discretization of the EUV light aperture 70.

Figure 2C:
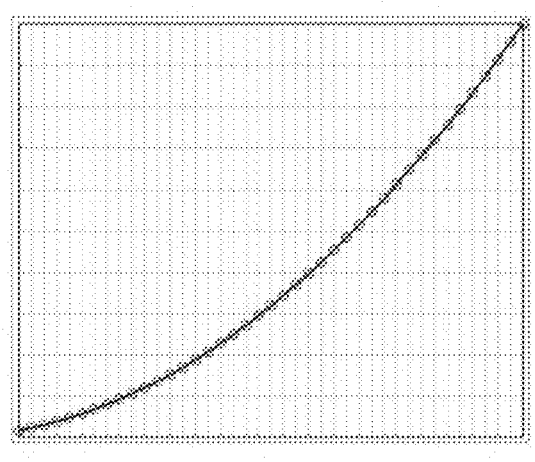
Figure 2D:
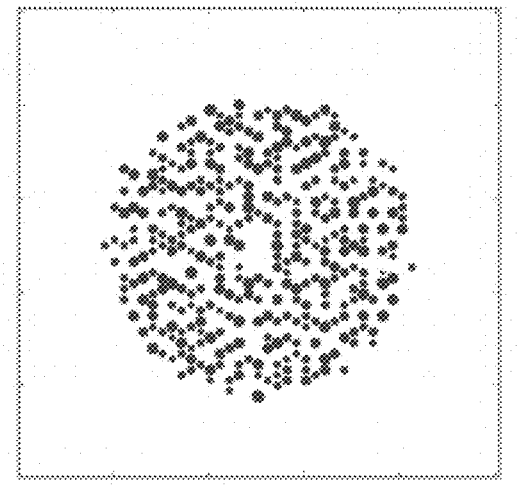
Figure 3:
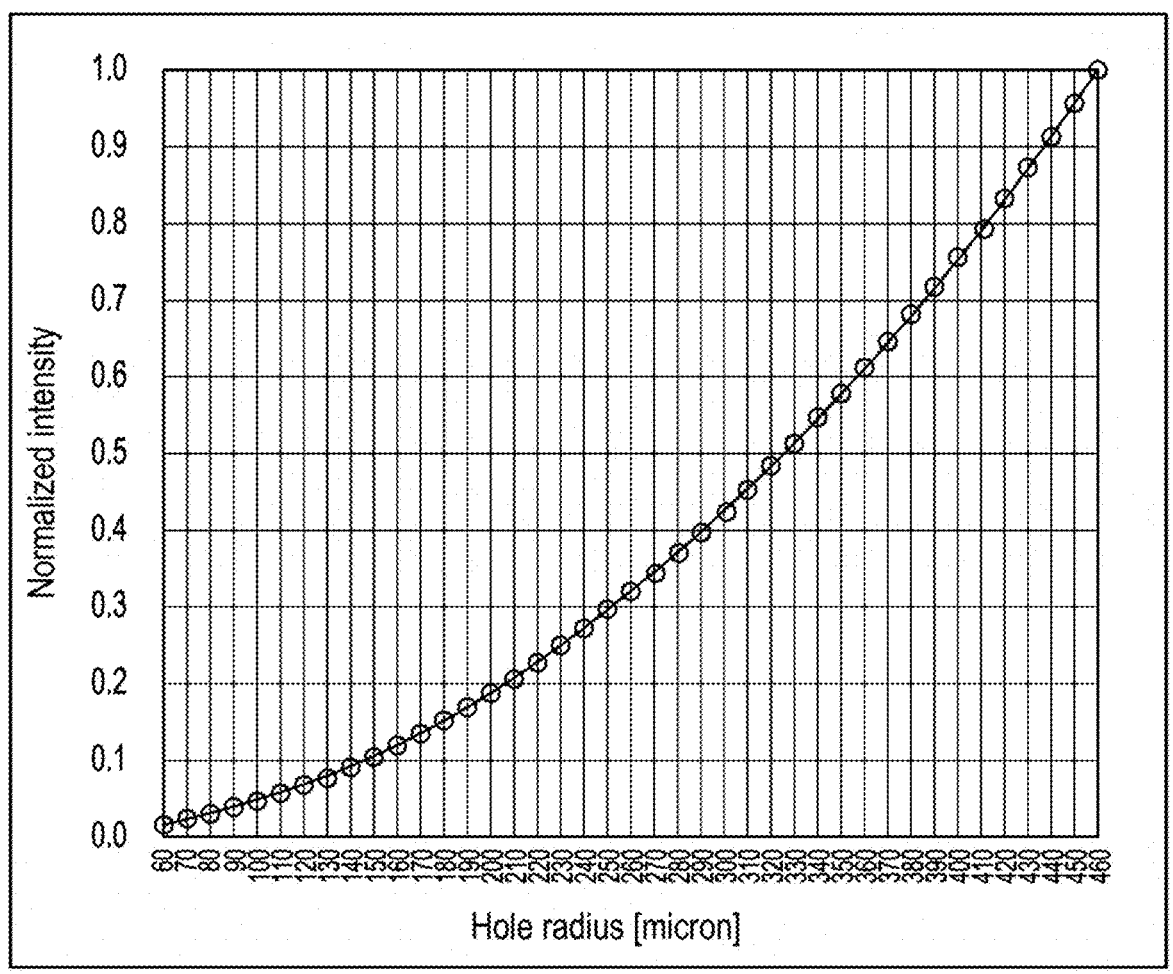
FIG. 3 diagrammatically illustrates an intensity versus radius-squared plot suitably employed in the diagrammatic representation of FIG. 2(C).

With reference to FIG. 2(C) and FIG. 3, the fitted grid of light intensities 72 of FIG. 2(B) is transformed to a set of through-hole diameters using an intensity versus through-hole radius transform shown in FIG. 2(C) and as an enlarged view with axes labeled in FIG. 3. For a given through-hole, the light intensity I scales with the area of the through-hole, and hence the light intensity scales with the square of the radius R of the through-hole, that is, $I \propto R^2$. Hence, brighter points of the fitted grid 72 correspond to larger-diameter through-holes. This illustrative intensity-to-through-hole size relationship assumes the through-holes 26 have circular cross-section which is typical for laser drilled through-holes. If the through-holes have another cross-section geometry, then a suitable intensity-to-through-hole cross sectional area relationship can be substituted for the example given in FIG. 3. For example, if the through-holes have square cross-section of side length d then $I \propto d^2$ would be a suitable relation.

Figure 2E:
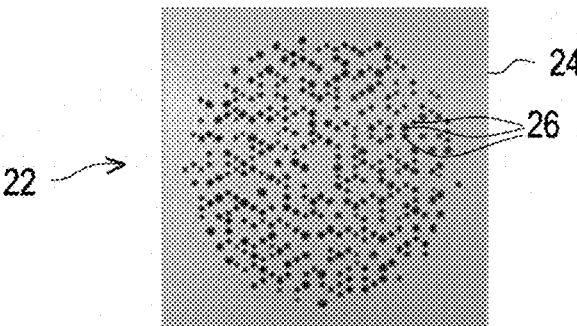
Figure 4:
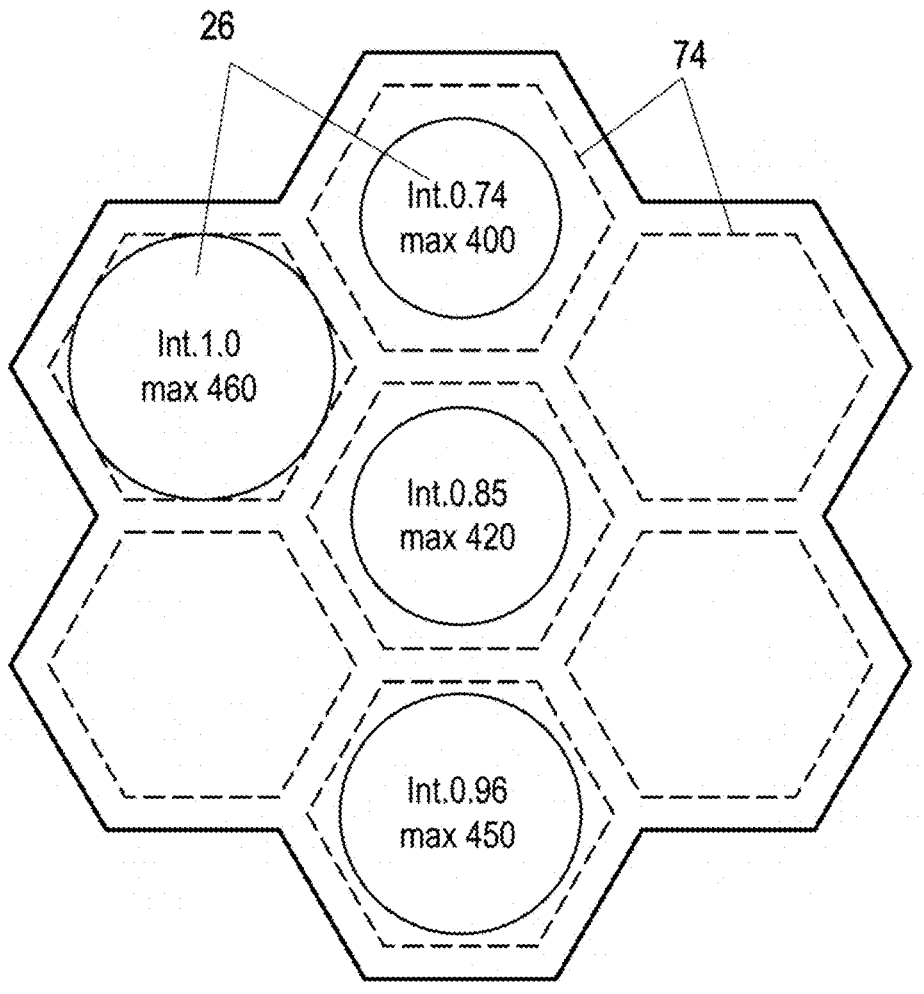
FIG. 4 diagrammatically illustrates formation of a few openings of the SMO aperture manufactured by the process of FIGS. 2A-2E.

To manufacture the physical light-shaping aperture 22 shown in FIG. 2(E), through-holes 26 are drilled in a plate 24. As EUV light is readily absorbed by most materials, the plate 24 can in general be made of any EUV-absorbing material with sufficient rigidity (possibly being rigid due to tension when mounted in the frame of the slider 20 of FIG. 1). In one nonlimiting illustrative embodiment, the plate 24 is a stainless steel plate with a thickness of about 0.1 mm, and the through-holes 26 are formed by laser drilling. (In another nonlimiting illustrative embodiment, the through-holes 26 may be formed by mechanical drilling. In another nonlimiting illustrative embodiment, the through-holes 26 may be formed by a photolithographic process using a photomask corresponding to the layout 72 of FIG. 2(B)). FIG. 4 diagrammatically shows an example of a small region of the resulting light shaping aperture 22 including indicated seven cells 74 of the hexagonal grid 72 of FIG. 2(B) and illustrating corresponding drilled through-holes 26 aligned with the hexagonal grid cells 72, with the drilled through-holes 26 being of varying diameter corresponding to the local light intensity as labeled in FIG. 4. It should be noted that the hexagonal grid 74 is not physically present on the plate 24 of the light shaping aperture 22, but rather is a geometrical construct used to define the locations of the drilled through-holes 26 as shown in FIG. 2(B). As further seen in FIG. 4, some cells of the hexagonal grid may not have any corresponding drilled through-hole, as the EUV aperture does not have light intensity in the locations of those cells. Furthermore, as previously noted, the hexagonal grid could be replaced by a Cartesian grid or other array or pattern of through-holes.

With the hexagonal (or other) grid and intensity-to-through-hole area interpolation, the light shaping aperture can closely approximate a complex SMO aperture. The EUV light shaping aperture 22 has substantial advantages of simplicity of manufacturing and the ability to reproduce substantially any type of EUV aperture. By comparison, implementing such a light aperture in an actual EUV lithography scanner typically relies upon a highly complex and expensive EUV mirror arrangement with many mirror adjustment actuators.

Figure 5:
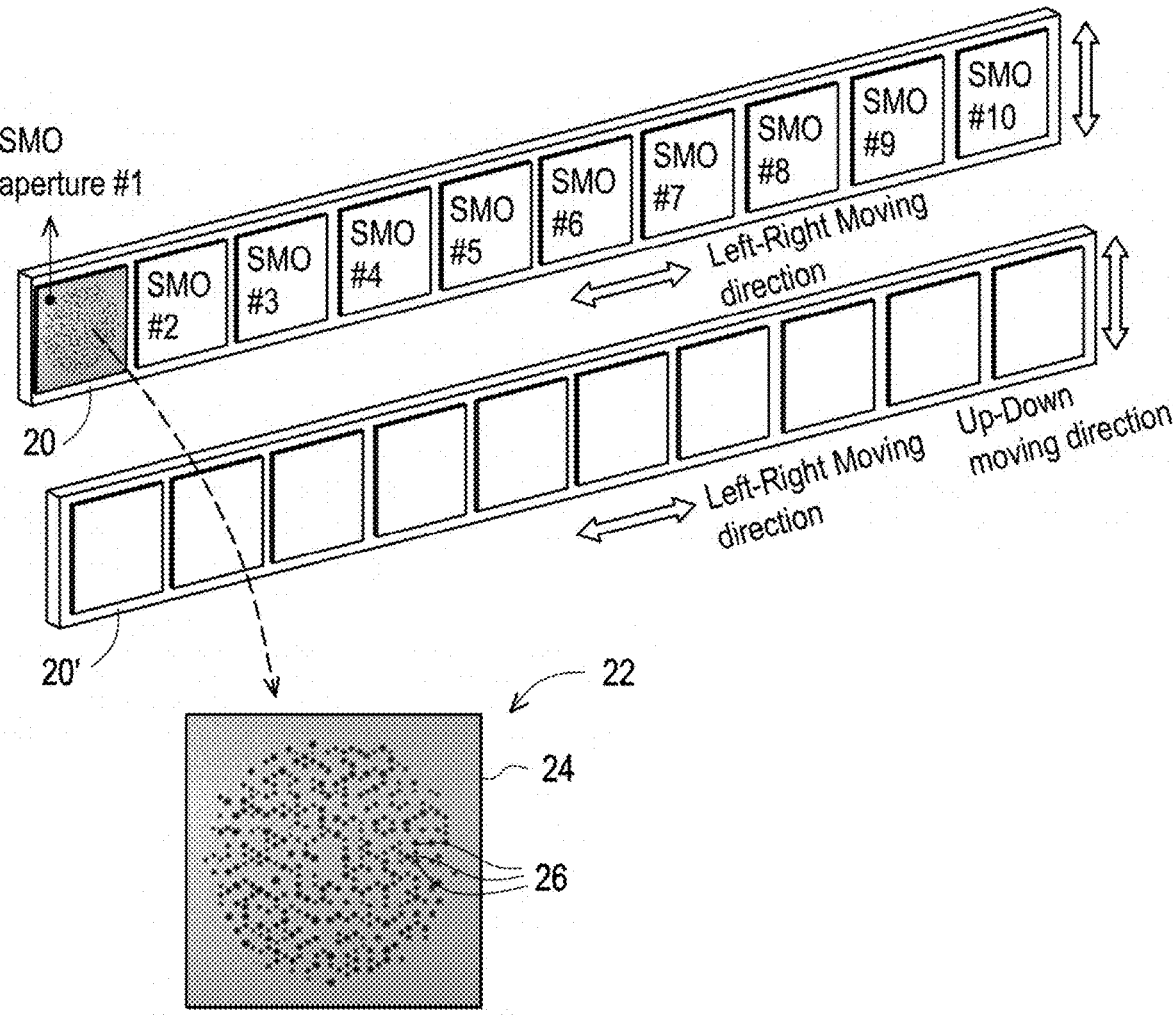
FIG. 5 diagrammatically illustrates an SMO aperture slider for enabling the system of FIG. 1 to switch between different SMO apertures while maintaining the actinic EUV mask inspection system under vacuum.

With reference back to FIG. 1 and further reference now to FIG. 5, an enlarged view of an embodiment of the slider 20 is shown. In this illustrative example, the slider 20 carries ten light shaping apertures identified as "SMO aperture #1", . . . , "SMO aperture #10", each providing an SMO-optimized EUV light aperture for a corresponding SMO-optimized mask. FIG. 5 also shows an enlarged isolation view of "SMO aperture #1". The slider 20 is operable from outside of the vacuum chamber 10 to position a selected EUV light shaping aperture 22 of the plurality of EUV light shaping apertures such that the transmitted EUV light transmits through the selected EUV light shaping aperture and then onto the associated EUV mask mounted on the mask stage. In other words, the EUV light L1 from the EUV light source 12 passes through the selected EUV light shaping aperture so that the output light L2 conforms with the EUV light aperture provided by the selected EUV light shaping aperture. As indicated by double-arrows in FIG. 5, the slider is movable in the horizontal direction (for the slider orientation shown in FIG. 5) to switch between the various light shaping apertures (e.g. between "SMO aperture #1", . . . , "SMO aperture #10"). Optionally, the slider may also be movable in the vertical direction (for the shown slider orientation) to precisely position the light shaping aperture in the EUV light beam. These movements of the slider are suitably performed using a vacuum-compatible motor (not shown) disposed in the vacuum chamber 10 and connected with the slider 20, or using a motor external to the vacuum chamber 10 that is coupled by way of a vacuum-tight mechanical coupling employing a bellow or the like. As previously described with reference to FIG. 1, the SMO aperture select process 50 run by the computer or other electronic processing device 40 suitably controls movement of the slider 20, and may in some embodiments implement a preprogrammed recipe to perform a sequence of mask inspection processes with different SMO apertures, for example.

It should be noted that although FIG. 5 shows all light shaping apertures as SMO apertures, one or more or all of the carried light shaping apertures could be other types of apertures, such as providing the EUV light L2 shaped to have a particular beam diameter. In this case, the light shaping aperture may have a single large central opening corresponding to the desired EUV beam diameter. As a further variant, FIG. 5 illustrates that a second slider 20' (and optionally third or more additional sliders) may be provided. In one approach, each slider 20, 20' may carry a set of light shaping apertures for a particular IC fabrication technology or IC manufacturing layer, so that whenever a mask 16 of that IC fabrication technology or layer is to be inspected the appropriate slider (e.g. slider 20 or slider 20') is loaded into the EUV actinic mask review system. In another approach, the motorized mechanism can be configured to handle two (or more) sliders and switch to the slider carrying the selected light shaping aperture, and then move that slider horizontally to place the selected aperture on that slider into the EUV light beam.

Figures 6A, 6B:
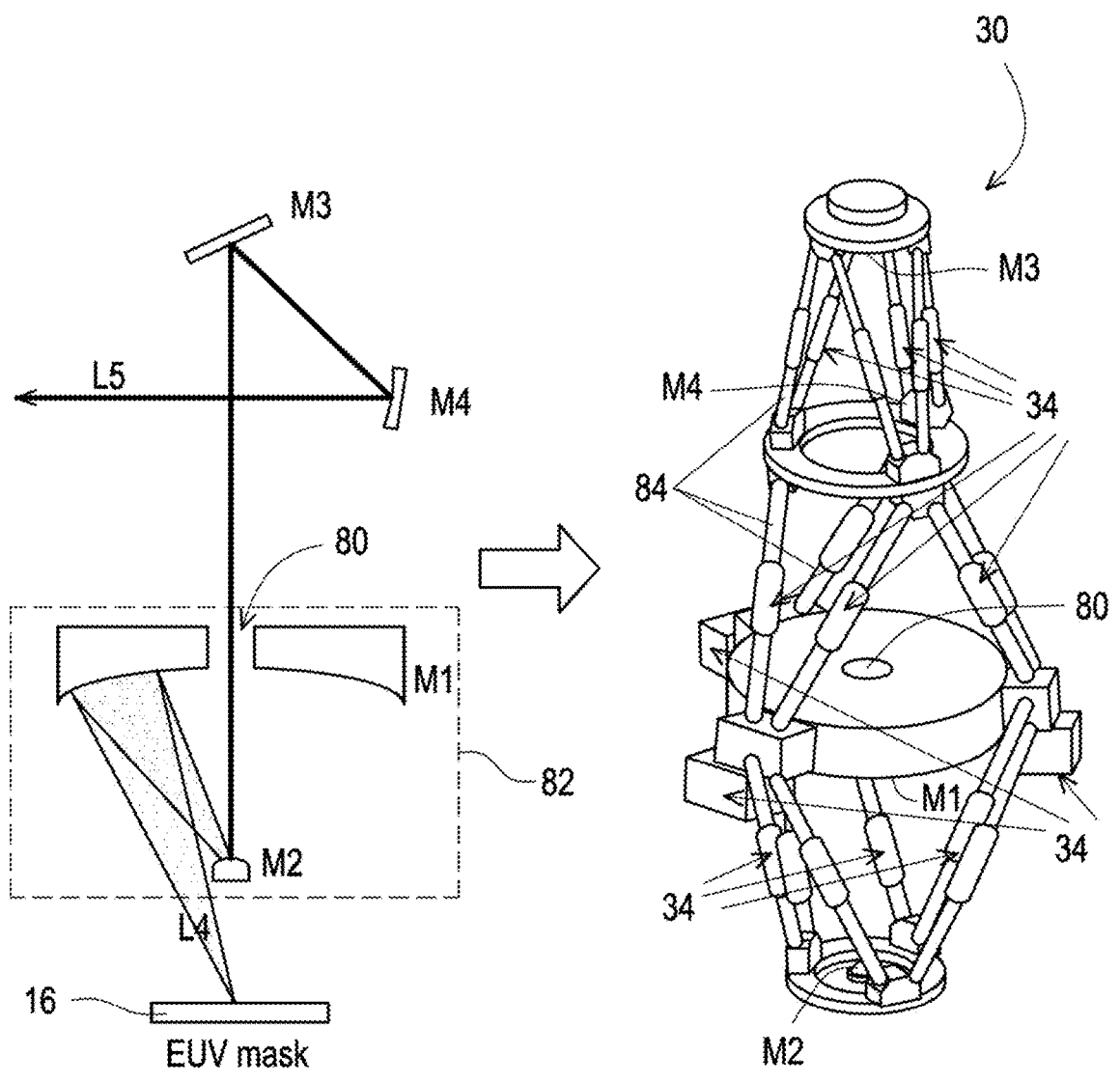
FIG. 6(A) diagrammatically illustrates an optical path of a mirror assembly of a projection optics box (POB) suitably used in the system of FIG. 1, and FIG. 6(B) diagrammatically illustrates a perspective view of the mirror assembly of FIG. 6(A) with actuators for adjusting the mirrors to implement a beam optimization process for the POB while maintaining the actinic EUV mask inspection system under vacuum.

With reference now to FIGS. 6(A) and 6(B), some illustrative embodiments of the projection optics box (POB) 30 and its actuators 34 are further described. FIG. 6(A) illustrates a ray diagram for the illustrative POB 30, while FIG. 6(B) illustrates a perspective view of the illustrative POB 30 including the actuators 34. The illustrative POB 30 comprises an assembly or set of four mirrors, designated mirror M1, mirror M2, mirror M3, and mirror M4. The mirror M1 is a concave mirror that receives the EUV light L4 reflected from the EUV mask and focuses it toward the mirror M2 which is a convex mirror. The convex mirror M2 reflects the light through a central opening 80 of the concave mirror M1. The combination of the concave mirror M1 having the central opening 80 and the convex mirror M2 disposed opposite to the central opening of the concave mirror M1 form a Schwarzschild optical sub-system 82 as diagrammatically indicated in FIG. 6(A). The EUV light output by the mirror M2 passes through the central opening 80 to reflect off mirror M3 and then mirror M4 to form the EUV light L5 that impinges on the EUV imaging sensor 32 as shown in FIG. 1. It will be appreciated that this is a nonlimiting illustrative optical train of the illustrative POB 30, and that other mirror arrangements and numbers of mirrors may be employed to implement the optical train of the projection optics box 30.

As seen in FIG. 6(B), the set of mirrors M1, M2, M3, M4 making up the optical train of the POB 30 are secured together by interconnecting struts 84 which may for example comprise tubes of stainless steel or another suitably rigid and vacuum-compatible material. In the absence of the actuators 34, the struts 84 would provide a rigid assembly of the set of mirrors M1, M2, M3, M4 that would be unable to be adjusted. In one approach for optical alignment without the actuators 34, the POB 30 is optically aligned at atmosphere using an alignment laser (e.g. HeNe laser) or the like. This type of alignment does not provide direct feedback as to the EUV beam that will be produced by the POB 30. Moreover, in the absence of the actuators 34, there is no way to fine-tune the optical alignment of the POB 30.

By way of the actuators 34 of the disclosed POB 30, the optical train of the POB 30 including the set of mirrors M1, M2, M3, M4 can be adjusted in situ, with the vacuum drawn in the vacuum chamber 10, thus enabling the optical alignment to be fine-tuned. Moreover, during such in situ adjustments (and with reference back to FIG. 1) the EUV light source 12 can be operating along with the EUV imaging sensor 32, so that by mounting a reflective mask or a dedicated flat alignment mirror on the mask stage 18 the EUV beam (including the beam shape) that is output by the POB 30 can be directly monitored by the EUV imaging sensor 32 during the alignment process. This allows the beam optimization process 60 (see FIG. 1) to perform feedback-controlled adjustment of the POB 30 using the actuators 34 to optimize the EUV beam as observed by the imaging sensor 32 during the alignment process. The beam optimization process can use any suitable metrics for quantifying the beam quality observed by the imaging sensor 32, such as the beam diameter, beam full width at half maximum (FWHM), beam uniformity over a defined area, and/or so forth, and various actuators 34 can be operated while monitoring these metrics to optimize the metrics thereby obtaining an optimized alignment of the optics of the POB 30.

Figure 7:
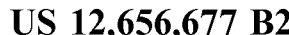
FIG. 7 diagrammatically illustrates an enlarged view of FIG. 6(B), with the actuators labeled by type.

With reference now to FIG. 7, the perspective view of the illustrative embodiment of the POB 30 is shown with various actuators 34 labeled by type. Actuators 34 of Type A (labeled "Type A actuator" in FIG. 7) are integrated into the struts 84 interconnecting the set of mirrors M1, M2, M3, M4, and are operable to adjust lengths of the struts 84. By adjusting a length of a strut 84 using a Type A actuator 34 integrated into the strut, the spacing between the two mirrors interconnected by that strut 84 is correspondingly adjusted. Depending on which struts 84 are lengthened or shortened using the Type A actuators, the spacing between mirrors and/or the relative tilt between two mirrors can be adjusted. For example, if all the struts interconnecting mirror M3 to mirror M4 are lengthened using the Type A actuators integrated into those struts 84, then the spacing between the mirrors M3 and M4 will be increased. Conversely, if all the struts interconnecting mirror M3 to mirror M4 are shortened using the Type A actuators integrated into those struts 84, then the spacing between the mirrors M3 and M4 will be decreased. Furthermore, if the struts interconnecting mirror M3 to mirror M4 are lengthened or shortened by different amounts, then the relative angle between the mirrors M3 and M4 will be adjusted.

Actuators 34 of Type B (labeled "Type B actuator" in FIG. 7) are interposed between mounting points 86 of the mirror assembly (which includes set of mirrors M1, M2, M3, M4 and the struts 84) and supports 88 on which the mounting points 86 rest and/or to which the mounting points 86 are secured. By adjusting the Type B actuators together, the entire mirror assembly can be translated up or down (for the orientation shown in FIG. 7). By adjusting the Type B actuators by different amounts, the entire mirror assembly can be tilted relative to the mask stage 18 and EUV imaging sensor 32.

Actuators of Type C (labeled "type C actuator" in FIG. 7) are directly connected to a mirror to enable the tilt of that mirror to be adjusted using the Type C actuators. FIG. 7 illustrates Type C actuators for tilting the mirror M3 by way of an inset of FIG. 7; however, it will be appreciated that Type C actuators can be included in any or all of the mirrors M1, M2, M3, M4 of the optical assembly of the POB 30.

A given embodiment may include only a subset of the illustrated actuators, and/or may omit actuators of certain types. For example, the Type B actuators could be omitted while still retaining substantial adjustability to the POB 30.

Figure 8:
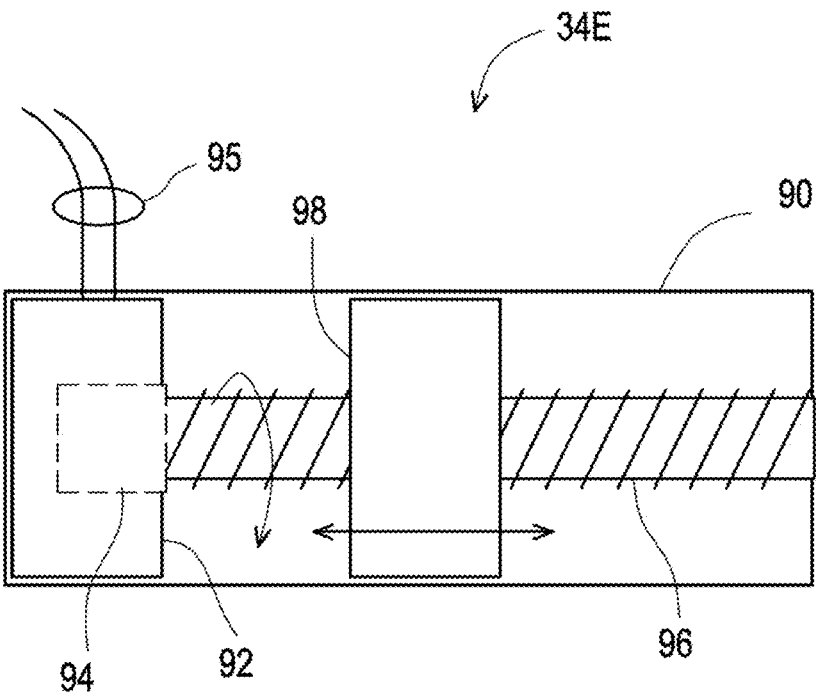
FIG. 8 diagrammatically illustrates an electrically driven actuator that may be used to implement the actuators shown in FIGS. 6(B) and 7.

With reference to FIG. 8, an electrically driven actuator 34E is diagrammatically illustrated, as an example that may be used to implement the actuators 34 shown in FIGS. 6 and 7. The illustrative electrically driven actuator 34E includes a housing 90 with a fixed block 92 at one end that supports a motor 94 that is powered by electrical leads 95 to rotate a threaded shaft 96. (Alternatively, the fixed block 92 could be a fixed stator of the motor 94). The electrical leads 95 (or an electrical cable connecting therewith, not shown) may suitably extend to an electrical feedthrough port of the vacuum chamber 10 of FIG. 1 to enable the electrically driven actuator 34E to be operated from outside of the vacuum chamber 10, e.g. with a vacuum drawn on the vacuum chamber 10. A shuttle 98 is threadedly engaged with the threaded shaft 96. The shuttle 98 is prevented from rotating by engagement of an outer surface or surfaces of the shuttle 98 with inner surface(s) of the housing 90. For example, the shuttle 98 could have a square or rectangular outer perimeter that fits inside a square or rectangular inner perimeter of the housing 90. Consequently, the shuttle 98 moves linearly (specifically horizontally for the illustrative orientation of the actuator 34E shown in FIG. 8) in response to rotation of the threaded shaft 96 by operation of the motor 94. Operating the motor to rotate the threaded shaft 96 in one direction (e.g. clockwise) drives the shuttle 98 away from the fixed block 92 (e.g., to the right for the orientation shown in FIG. 8); while, operating the motor to rotate the threaded shaft 96 in the opposite direction (e.g. counterclockwise) draws the shuttle 98 toward the fixed block 92 (e.g., to the left for the orientation shown in FIG. 8).

To implement a Type A actuator 34 using the nonlimiting illustrative example electrically driven actuator 34E of FIG. 8, the strut 82 into which the Type A actuator is integrated is suitably split into two sub-struts end-to-end by the actuator 34E, with the end of one sub-strut secured to the fixed block 92 (or, equivalently, to the housing 90), and the proximate end of the other sub-strut secured to the shuttle 98. In this way, the electrically driven actuator 34E can stretch the strut 82 by rotating the threaded shaft 96 to drive the shuttle 98 away from the fixed block 92, and can shrink the strut 82 by rotating the threaded shaft 96 in the opposite direction to draw the shuttle 98 toward the fixed block 92. A Type B actuator can be similarly implemented by securing a mounting point 86 to the fixed block 92 and the corresponding support 88 to the shuttle 98 (or vice versa). A Type C actuator for tilting the illustrative mirror M3 as shown in FIG. 7 can be similarly implemented by securing an edge of the mirror M3 to the fixed block 92 and a corresponding strut or other structural support of the mirror M3 to the shuttle 98 (or vice versa).

The electrically driven actuator 34E of FIG. 8 is an example of a stepper motor driven screw-type actuator, and other designs of such a stepper motor driven screw-type actuator can be similarly utilized. Moreover, it will be appreciated that this is only one illustrative example of a suitable embodiment of the actuators 34, and the more generally any type of actuator that provides an extension/contraction mechanism can be similarly utilized. Still further, it is contemplated for the actuators 34 to be a pneumatically or hydraulically driven actuator, such as an expandable piston with spring-loading to bias the piston against the pneumatic or hydraulic expansion force. Notably, the travel for the actuators 34 is typically relatively small since the struts 84 are suitably designed to provide coarse optical alignment of the POB 30 and the actuators 34 are then used for fine adjustment. In one nonlimiting illustrative example, the Type A actuators have a maximum travel in the range 5 mm to 20 mm, the Type B actuators have a maximum travel in the range 5 mm to 10 mm, and the Type C actuators have a maximum travel in the range 2 mm to 10 mm. These are nonlimiting illustrative examples, and more generally the maximum travel for the actuators 34 is suitably chosen based on the size and geometry of the POB 30 and the extent of fine tuning of the alignment that is credibly anticipated.

Figure 9:
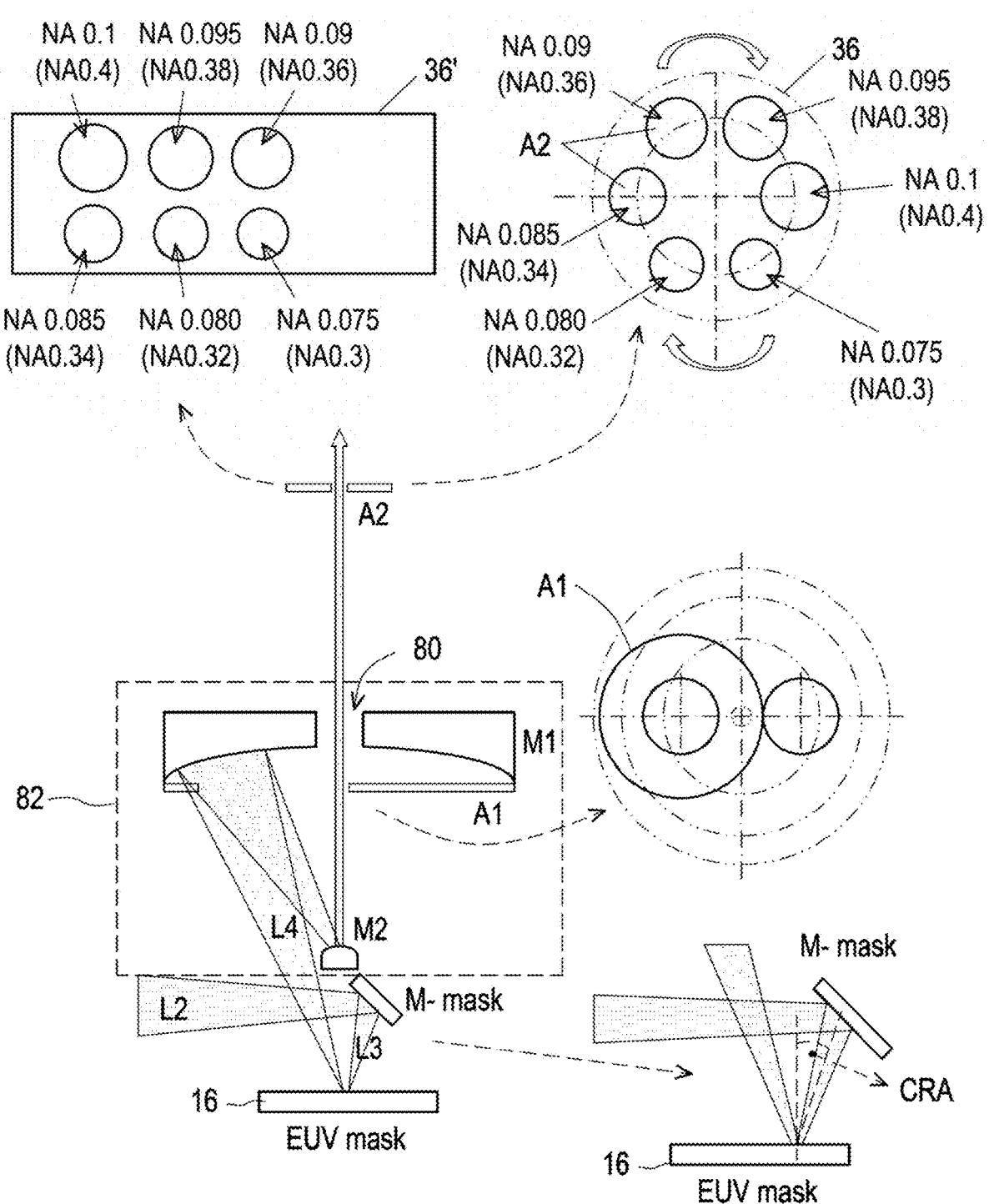
FIG. 9 diagrammatically illustrates a portion of the mirror assembly of FIGS. 6 and 7 together with apertures for providing a beneficial combination of high light collection and a numerical aperture (NA) that is adjustable while maintaining the actinic EUV mask inspection system under vacuum.

With reference now to FIG. 9, some illustrative embodiments of the apertures A1 and A2 of the POB 30 are described. FIG. 9 diagrammatically illustrates a portion of the mirror assembly of FIGS. 6 and 7 including mirrors M1 and M2 together forming the Schwarzschild optical subsystem 82, together with apertures A1 and A2 which provide a beneficial combination of high light collection and a numerical aperture (NA) that is adjustable while maintaining the actinic EUV mask inspection system under vacuum. In the illustrative design, the first aperture A1 is designed to enhance EUV light collection by making it as large as feasible, while the second aperture A2 is selectable by way of the illustrative carousel 36 which carries a plurality of apertures A2 that provide different numerical aperture (NA) values for the POB 30. In another embodiment, a slider 36' carries the plurality of apertures A2. The carousel or slider 36, 36' suitably includes or is operatively connected with a sealed vacuum-compatible motor or other motive mechanism (not shown) controlled by the POB NA selection process 56 (see FIG. 1) to insert a selected second aperture A2 into the optical path of the POB 30 to set the NA of the POB 30 in accordance with the selected aperture. As indicated in FIG. 9, in the illustrative examples of the carousel or slider 36, 36', the carried plurality of apertures A2 include six apertures A2 to provide the POB 30 with a selectable numerical aperture of: 0.1, 0.095, 0.09, 0.085, 0.080, or 0.075. It will be understood that the carousel or slider 36, 36' can be readily modified to carry more or fewer apertures, such as two apertures, three apertures, four apertures, six apertures (as shown), eight apertures, and/or so forth.

FIG. 9 also lists a parenthetical NA below each of these values—this parenthetical NA is four times larger and corresponds to the NA at the wafer resulting from the 4× reduction that is assumed to be implemented by the EUV lithography scanner (yielding a selectable NA at the wafer of 0.4, 0.38, 0.36, 0.34, 0.32, or 0.3). It will be understood that this 4× adjustment at the wafer will depend on the magnification provided by the EUV lithography scanner and hence may be different for different implementations. The illustrative example of the selectable aperture A2 is designed in conjunction with the first aperture A1 which in this example is designed to create maximum NA collection of ±6 degrees (NA ~0.105) by the first aperture A1 (which is a fixed aperture) without interference with illumination. As shown in FIG. 9, the second aperture A2 is located after the Schwarzchild optical subsystem 82, that is, is inserted in the EUV light beam that is reflected from the mirror M1 after passing through the central opening 80 of the mirror M1. More generally, the second aperture A2 can be inserted anywhere after the Schwarzchild optical subsystem 82 in the optical path of the POB 30. The selection ability of the second aperture A2 provided by the carousel or slider 36 or 36' advantageously provides flexibility in matching the result with a scanning electron microscopy (SEM) image of the wafer.

Figure 10:
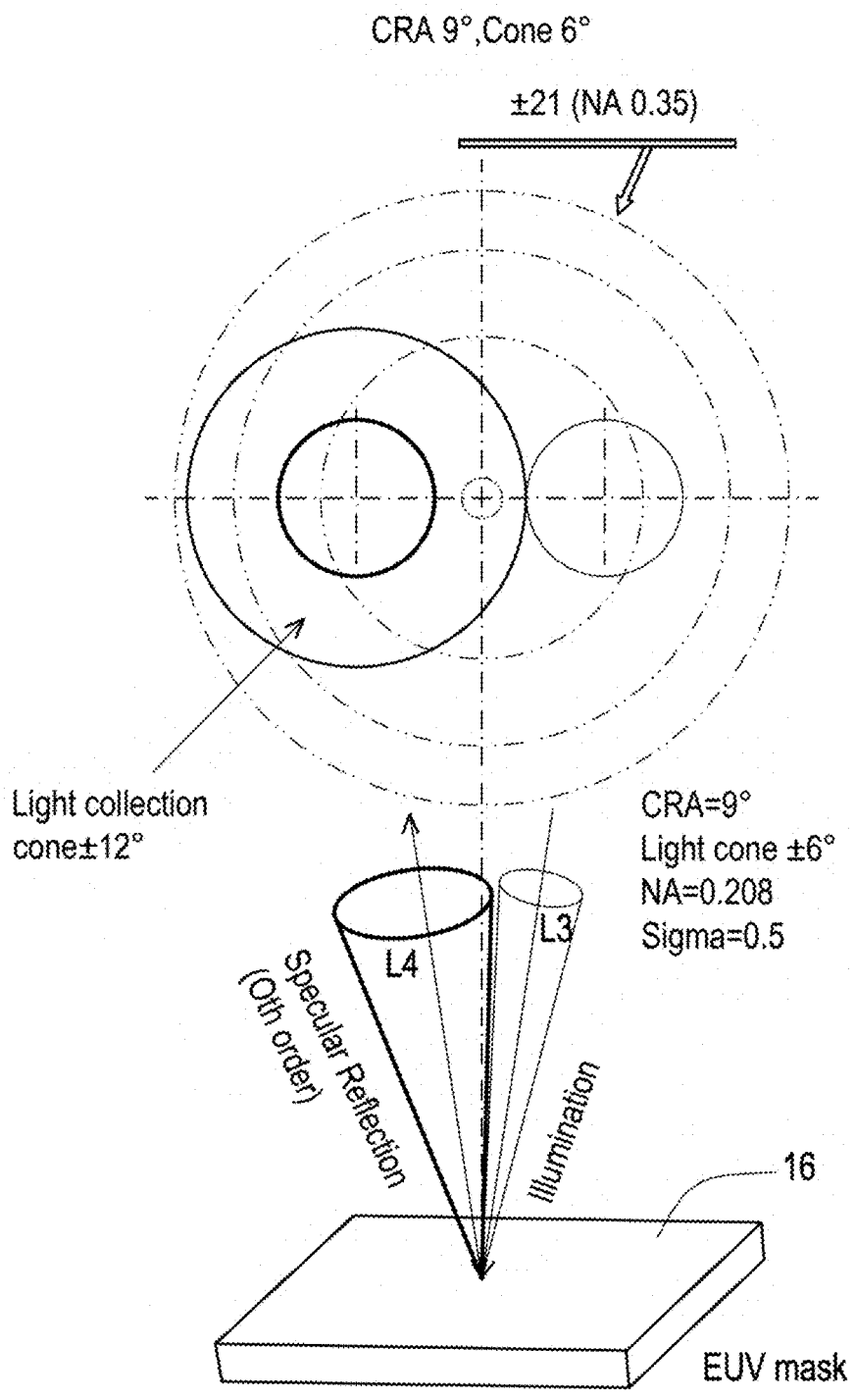
FIG. 10 and FIG. 11 diagrammatically illustrate various embodiments of the first aperture of the POB box of FIG. 9 by way of a top view of the aperture geometry and a perspective view of an EUV mask under inspection with beam cones superimposed.

With continuing reference to FIG. 9 and with further reference to FIGURE the first aperture A1 is a fixed aperture which is designed to maximize light collection. This is feasible since the control of the NA of the POB 30 is handled by the selectable second aperture A2. This arrangement was motivated by recognition herein of some disadvantages of the asymmetric POB 30 including the Schwarzchild optical subsystem 82. The latent image printed on the photoresist (or, analogously, captured by the imaging sensor 32 of FIG. 1) under asymmetric POB projection is deformed, and it does not match the desired EUV scanner printing shape. This asymmetric POB projection will cause orientation dependence of mask pattern defect location in the mask inspection image captured by the imaging sensor 32. As seen in FIG. 10, by dividing the tasks of light collection performed by the first aperture A1 and control of the POB NA provided by the second aperture A2, this allows the first aperture A1 to be enlarged, and as seen in FIG. 10 this can in turn allow for the geometry of the EUV actinic mask review system to be modified to illuminate the EUV mask 16 with the EUV light L3 impinging at a larger angle, e.g. at a chief ray angle (CRA) of at least 8 degrees, and in the example of FIG. 10 a CRA of 9 degrees. By comparison, if only the aperture A1 is used (without the second aperture A2), the maximum CRA is typically around ±6 degrees. The larger CRA achievable in the design of FIGS. 9 and 10 in turn allows the light collection cone for the light L4 reflected from the mask 16 to be increased. Note that due to the reflected light L4 reflecting by specular reflection, the reflected light L4 reflects along a CRA that is equal to the CRA of the impinging light L3. Also, as seen in FIGURE the CRA is measured respective to the surface normal of the mask 16. In the example of FIG. 10, the impinging light L3 with CRA of 9 degrees has a cone angle of +6 degrees. The light reflection cone L4 also has a CRA of 9 degrees, and the light collection cone of the reflected light L4 is ±12 degrees. As annotated in FIG. 10, this specific design provides a NA of 0.208 and sigma=0.5. As further seen in FIGS. 9 and 10, this large aperture size for the aperture A1 also enables a single aperture opening to both collect the large cone angle of reflected light L4 and also provide the opening for passing the EUV light reflected by the mirror M2 through the central opening 80 of the mirror M1 of the Schwarzchild optical subsystem 82. Put another way, the collected NA can cross the center-line of the mirror M1.

Figure 11:
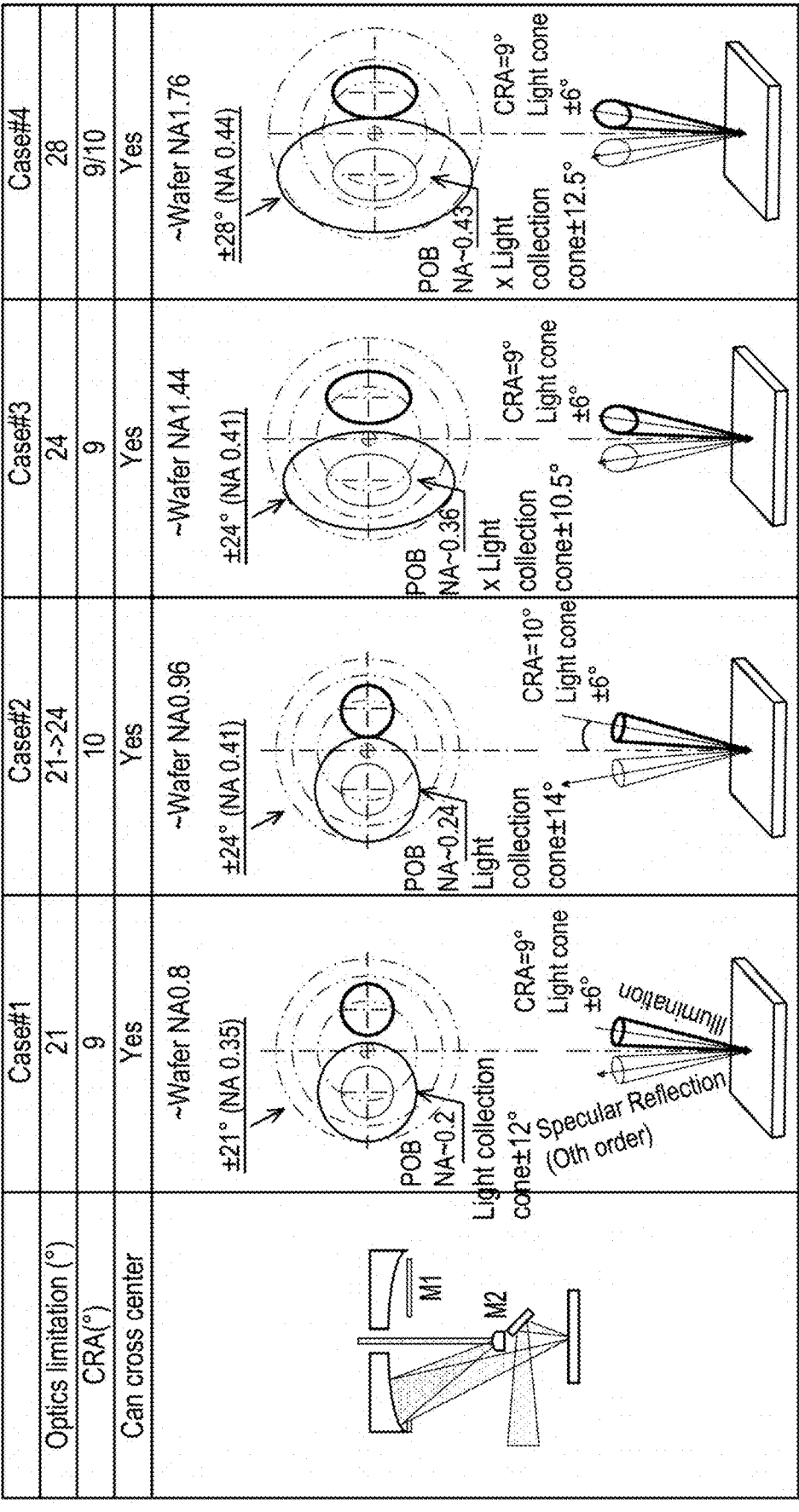

With reference to FIG. 11, four further examples of designs of the aperture A1 are shown, using the same illustration approach as used in FIG. 9. The four examples are designated as "Case #1", "Case #2", "Case #3", and "Case #4". The example of Case #1 provides a CRA of 9 degrees and a collection cone of +12 degrees, with a POB NA of about 0.2 (without considering the NA reduction provided by the second aperture A2). The example of Case #2 provides a CRA of 10 degrees and a collection cone of +14 degrees, with a POB NA of about 0.24.

Cases #1 and #2 employ the aperture A1 as a circular aperture. As shown in Case #3 and Case #4, further enhancement of the light collection can be provided by employing an oval (but noncircular) aperture for the aperture A1. The Example of Case #3 employs an oval aperture to provide a CRA of 9 degrees and a collection cone of +10.5 degrees, with a larger POB NA of about 0.36 which is increased due to the oval aperture. The Example of Case #4 employs an oval aperture to provide a CRA of 9 degrees and a collection cone of +12.5 degrees, with a POB NA of about 0.43 which is again increased due to the oval aperture.

In addition to a larger POB NA provided by the fixed aperture A1 which can then be set to a selectable lower value using the carousel or slider 36, 36' carrying the selectable apertures A2, the approach allows for changing the CRA of the impinging EUV light L3 so as to obtain greater symmetry in the NA POB design. The larger maximum NA attainable using the improved aperture A1 also can facilitate obtaining the inspection image of the mask 16 with higher resolution. The large and symmetric circle and ellipsoid NA thus provide high resolution and a symmetric geometry for the actinic image of the mask 16 to assess any defect pattern in both X and Y directions.

Figure 12:
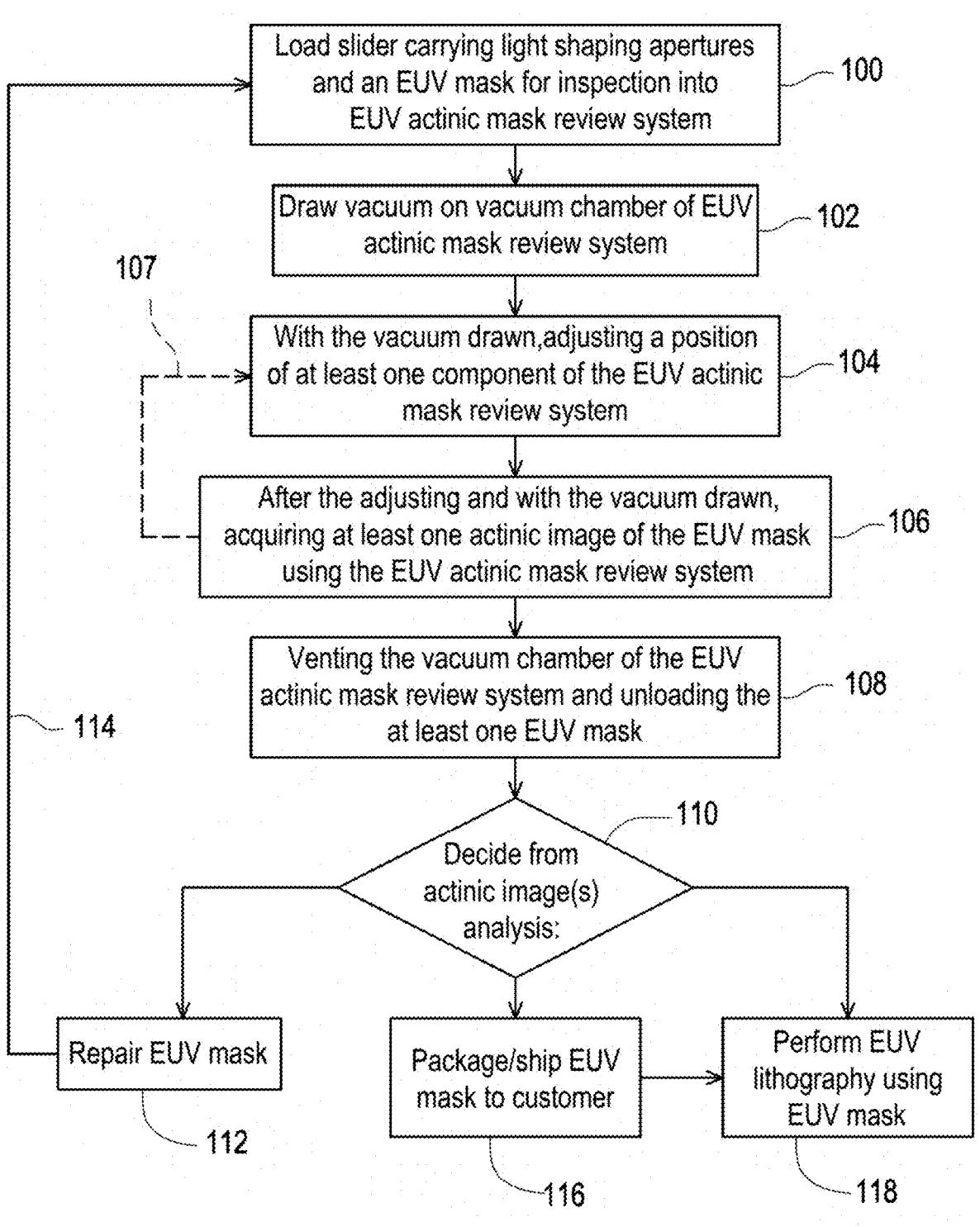
FIG. 12 diagrammatically illustrates an actinic EUV mask inspection method.

With reference to FIG. 12, an actinic EUV mask inspection method is diagrammatically shown. The actinic EUV mask inspection method may, for example, be performed using the actinic EUV mask inspection system of FIG. 1. In an operation 100, the slider 20 carrying at least one, and possibly a plurality, of light shaping apertures 22 is loaded into the actinic EUV mask system, along with at least one EUV mask for inspection. If the EUV mask inspection system includes the mask stage 18 with no mechanism for transferring masks onto/off of the mask stage 18 while under vacuum, then only a single EUV mask is typically loaded directly onto the mask stage 18. On the other hand, if the actinic EUV mask inspection system includes a robotic mechanism for transferring masks onto/off of the mask stage 18 while under vacuum, then the operation 100 could entail, for example, loading a set of EUV masks for inspection into a mask storage elevator, mask carrier or pod, or the like that is connected with the EUV mask inspection system and from which the robotic mechanism can transfer wafers to the mask stage 18 while under vacuum.

In an operation 102, a vacuum is drawn in the vacuum chamber 10 containing (or included with) the EUV actinic mask review system. As an illustrative example, the EUV actinic mask review system may be configured substantially as shown in FIG. 1 and thus include the EUV illuminator 14, the mask stage 18, the POB 30, and the EUV imaging sensor 32. The drawn vacuum places the interior of the vacuum chamber 10 at a pressure which is below atmospheric pressure (1 atm=760 Torr=101 kPa), and that is sufficiently low to enable EUV light to pass through the evacuated ambient inside the vacuum chamber without unacceptable attenuation. In some nonlimiting illustrative embodiments, the drawn pressure in the vacuum chamber is around 750 mTorr (=100 Pa) or lower, although this is merely a non-limiting illustrative example. Drawing the vacuum may entail continuous pumping using a suitable vacuum pump or combination of vacuum pumps counteract outgassing from surfaces or other gas influx. The drawing of the vacuum may also include concurrently flowing a process gas such as hydrogen into the vacuum chamber to create a desired ambient composition in the evacuated vacuum chamber 10.

In an operation 104, with the vacuum drawn, a position of at least one component of the EUV actinic mask review system is adjusted. For example, the operation 104 may include, with the vacuum drawn, operating the slider 20 to position a selected EUV light shaping aperture 22 of the plurality of EUV light shaping apertures such that the subsequent acquisition of an actinic image includes transmitting the EUV light through the selected EUV light shaping aperture and then onto the EUV mask. As another example, the adjusting 104 may include, with the vacuum drawn, adjusting a position of at least one mirror of the set of mirrors M1, M2, M3, and M4 using the set of actuators 34 of the POB 30. For example, a length of at least one of the struts 84 of the POB 30 may be adjusted using at least one Type A actuator, and/or a tilt of the at least one mirror (e.g. mirror M3) may be adjusted using at least one actuator of the set of Type C actuators. As yet another example, the operation 104 may include, with the vacuum drawn, operating the slider 36' or carousel 36 of the POB 10 to insert a selected aperture A2 of the plurality of apertures into the optical path of the POB 30 to set a numerical aperture of the POB 30 to a value determined by the selected aperture A2. These are merely illustrative examples of possible adjustments made in the operation 104. It will be appreciated that the operation 104 may include two or more of these example adjustments and/or other adjustments made with the vacuum drawn.

In some embodiments in which the adjusting 104 includes adjusting a position of at least one mirror of the set of mirrors M1, M2, M3, M4 of the POB 30 using the set of actuators 34 of the POB 30, this may entail performing feedback-controlled beam optimization. Such optimization may entail transmitting the EUV light L2, L3 from the EUV illuminator 14 onto the EUV mask 16 (or onto an EUV mirror mounted on the mask stage 18) and projecting at least a portion of the EUV light L4 reflected by the EUV mask or EUV mirror onto the EUV imaging sensor 32 using the POB 30 and measuring a beam shape using the EUV imaging sensor 32. Feedback control of the adjusting of the position of the at least one mirror is then performed based on the measured beam shape, for example being done iteratively until the measured beam shape conforms with a desired beam diameter, beam uniformity, or other beam metric.

With continuing reference to FIG. 12, in an operation 106, after the adjusting 104 and with the vacuum drawn per operation 102, an actinic image (or a set of actinic images) are acquired of the EUV mask 16 mounted on the mask stage 18 using the EUV imaging sensor 32. The actinic image acquisition includes transmitting EUV light L2, L3 from the EUV illuminator 14 onto the EUV mask 16 and projecting at least a portion of the EUV light L4 reflected by the EUV mask 16 onto the EUV imaging sensor 32 using the POB 30.

If the actinic EUV mask inspection system includes a robotic mechanism for loading another EUV mask for inspection while under vacuum, then as indicated in FIG. 12 by a dotted feedback arrow 107 the process flow may then include loading the new mask and returning process flow to the operation 104 to make any adjustments to the actinic EUV mask inspection for inspecting the next EUV mask. These adjustments might include, for example, operating the slider 20 to load an appropriate SMO aperture 22 that was co-optimized for the next mask by source-mask optimization. Such repetition can be performed for all masks that were loaded into the mask storage elevator, mask carrier or pod, or the like in the operation 100. Optionally, a preprogrammed recipe executed by the computer or other electronic processing device 40 of FIG. 1 could be used to automate this batch-style processing.

With continuing reference to FIG. 12, after the mask 16 has been inspected according to operations 104 and 106 (or the last mask has been inspected, in the case of a batch mask inspection process), process flow passes to operation 108 where the vacuum chamber 10 is vented to atmosphere and the mask 16 is unloaded. In an operation 110, disposition of the mask is decided based on analysis of the actinic image(s) of the mask acquired in the operation 106. The image analysis may be semi-manual, where the actinic image is displayed on the display 46 of the computer or other electronic processing device 40 of FIG. 1 and a human analyst reviews the displayed actinic image(s). Additionally or alternatively, the image analysis may be an automated process, in which for example a reference actinic image of the EUV mask (or of another instance of an EUV mask with a nominally identical pattern) is compared with the actinic image acquired in the operation 106 and differences (if any) between the actinic image acquired in the operation 106 and the reference image are identified and optionally classified by characteristics such as type of difference (e.g. matching a detected region of image difference to a reference particulate image), size of the difference (e.g., a difference that is smaller than some threshold may be ignored), and/or so forth. In this latter case, the differences identified by the automated image comparison may be presented on the display 46 so as to expedite the review by the human analyst.

It will be appreciated that in some embodiments the chamber venting operation 108 and the actinic image analysis operation 110 may be swapped in time, so that the actinic image is reviewed per operation 110 prior to venting the chamber and unloading the EUV mask. This swapping may be useful so that, for example, if the analysis determines the actinic image acquired in operation 106 is insufficient to perform the mask inspection then the operations 104 and 106 can be repeated until an actinic image is obtained that is sufficient for performing the mask inspection.

With continuing reference to FIG. 12, based on the mask inspection analysis 110, various dispositions of the EUV mask may be made. In one example 112, if a defect is observed that is deemed to be repairable, the EUV mask may undergo the requisite mask repair. Thereafter, the repaired mask may be re-inspected as indicated in FIG. 12 by the process flow back arrow 114. On the other hand, if a defect (or defects) are observed which are deemed to be unable to be repaired and which make the mask unusable for EUV lithography, then the EUV mask may be scrapped (option not shown in FIG. 12). In another example 116, if the EUV actinic mask inspection method is being performed by a mask manufacturer for a customer, then if the inspection indicates the mask is satisfactory for use in EUV lithography and meets customer specifications then the inspected EUV mask may be packaged and shipped to the customer. Upon arrival at the customer, the mask may be unpackaged and deployed in an EUV lithography scanner to perform EUV lithography as indicated by option 118. For example, the option 118 may include fabricating an integrated circuit (IC) including performing at least one EUV lithography step using the EUV mask. As yet another example, if the EUV actinic mask inspection method is being performed by an IC fabrication facility then the IC fabrication facility may go directly to option 118, e.g. by loading the inspected EUV mask into an EUV lithography scanner of the IC fabrication facility and fabricating an IC including performing at least one EUV lithography step using the EUV mask.

In the following, some further embodiments are described.

In a nonlimiting illustrative embodiment, a method comprises: drawing a vacuum in a vacuum chamber containing an extreme ultraviolet (EUV) actinic mask review system comprising an EUV illuminator, a mask stage, a projection optics box, and an EUV imaging sensor; with the vacuum drawn, adjusting a position of at least one component of the EUV actinic mask review system; and after the adjusting and with the vacuum drawn, acquiring an actinic image of an EUV mask mounted on the mask stage using the EUV imaging sensor, the acquiring including transmitting EUV light from the EUV illuminator onto the EUV mask and projecting at least a portion of the EUV light reflected by the EUV mask onto the EUV imaging sensor using the projection optics box.

In a nonlimiting illustrative embodiment, an EUV actinic mask review system comprises: a mask stage configured to mount an associated EUV mask; an EUV illuminator arranged to transmit EUV light onto the associated EUV mask mounted on the mask stage; an EUV imaging sensor; a projection optics box configured to project at least a portion of the EUV light reflected by the associated EUV mask mounted on the mask stage onto the EUV imaging sensor; and a vacuum chamber containing the EUV illuminator, the mask stage, the EUV imaging sensor, and the projection optics box. The projection optics box includes: a concave mirror having a central opening; a convex mirror facing the concave mirror; and an aperture interposed between the concave mirror and the convex mirror. The aperture has an opening sized and positioned to pass EUV light reflecting from the EUV mask with a chief ray angle (CRA) of at least 8 degrees and to also pass EUV light reflecting from the convex mirror through the central opening of the concave mirror.

In a nonlimiting illustrative embodiment, an EUV actinic mask review system comprises: a mask stage configured to mount an associated EUV mask; an EUV illuminator arranged to transmit EUV light onto the associated EUV mask mounted on the mask stage, the EUV illuminator including an EUV light shaping aperture comprising a plate having through-holes passing through the plate; an EUV imaging sensor; a projection optics box configured to project at least a portion of the EUV light reflected by the associated EUV mask mounted on the mask stage onto the EUV imaging sensor; and a vacuum chamber containing the EUV illuminator, the mask stage, the EUV imaging sensor, and the projection optics box.

In a nonlimiting illustrative embodiment, an EUV actinic mask review system as set forth in the immediately preceding paragraph further includes a slider carrying a plurality of EUV light shaping apertures including the EUV light shaping aperture. The slider is operable from outside of the vacuum chamber to position a selected EUV light shaping aperture of the plurality of EUV light shaping apertures such that the transmitted EUV light transmits through the selected EUV light shaping aperture and then onto the associated EUV mask mounted on the mask stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

drawing a vacuum in a vacuum chamber containing an extreme ultraviolet (EUV) actinic mask review system comprising an EUV illuminator, a mask stage, a projection optics box, and an EUV imaging sensor;

with the vacuum drawn, adjusting a position of at least one component of the EUV actinic mask review system; and after the adjusting and with the vacuum drawn, acquiring an actinic image of an EUV mask mounted on the mask stage using the EUV imaging sensor, the acquiring including transmitting EUV light from the EUV illuminator onto the EUV mask and projecting at least a portion of the EUV light reflected by the EUV mask onto the EUV imaging sensor using the projection optics box;

wherein the EUV illuminator includes a slider carrying a plurality of EUV light shaping apertures, wherein one of the EUV light shaping apertures is a source-mask optimized illumination aperture for the EUV mask mounted on the mask stage.

2. The method of claim 1 wherein:

the adjusting comprises, with the vacuum drawn, operating the slider to position the source-mask optimized illumination aperture such that the acquiring includes transmitting the EUV light through the source-mask optimized illumination aperture and then onto the EUV mask.

3. The method of claim 1 wherein the projection optics box includes a set of mirrors and a set of actuators, and the adjusting comprises:

with the vacuum drawn, adjusting a position of at least one mirror of the set of mirrors using the set of actuators of the projection optics box.

4. The method of claim 3 wherein the projection optics box further includes struts interconnecting the set of mirrors, and the adjusting of the position of the at least one mirror includes:

adjusting a length of at least one of the struts of the projection optics box using at least one actuator of the set of actuators.

5. The method of claim 3 wherein the adjusting of the position of the at least one mirror includes:

adjusting a tilt of the at least one mirror using at least one actuator of the set of actuators.

6. The method of claim 3 wherein the adjusting of the position of the at least one mirror includes:

transmitting the EUV light from the EUV illuminator onto the EUV mask or onto an EUV mirror mounted on the mask stage and projecting at least a portion of the EUV light reflected by the EUV mask or EUV mirror onto the EUV imaging sensor using the projection optics box and measuring a beam shape using the EUV imaging sensor; and performing feedback control of the adjusting of the position of the at least one mirror based on the measured beam shape.

7. The method of claim 1 wherein:

the projection optics box further includes a slider or carousel which carries a plurality of apertures; and the adjusting comprises, with the vacuum drawn, operating the slider or carousel to insert a selected aperture of the plurality of apertures into an optical path of the projection optics box to set a numerical aperture of the projection optics box to a value determined by the selected aperture.

8. The method of claim 7 wherein the projection optics box further includes:

a Schwarzschild optical sub-system comprising a concave mirror having a central opening and a convex mirror facing the concave mirror; and a fixed aperture interposed between the concave mirror and the convex mirror, the fixed aperture having a single opening sized and positioned to pass EUV light reflecting from the mask with a chief ray angle (CRA) of at least 8 degrees and to also pass EUV light reflecting from the convex mirror through the central opening of the concave mirror.

9. The method of claim 1 further comprising:

after acquiring the actinic image, opening the vacuum chamber and removing the EUV mask; and fabricating an integrated circuit (IC) including performing at least one EUV lithography step using the EUV mask.

10. An extreme ultraviolet (EUV) actinic mask review system comprising:

a mask stage configured to mount an associated EUV mask;

an EUV illuminator arranged to transmit EUV light onto the associated EUV mask mounted on the mask stage, wherein the EUV illuminator includes a slider carrying a plurality of EUV light shaping apertures, wherein one of the EUV light shaping apertures is a source-mask optimized illumination aperture for the associated EUV mask;

an EUV imaging sensor;

a projection optics box configured to project at least a portion of the EUV light reflected by the associated EUV mask mounted on the mask stage onto the EUV imaging sensor; and a vacuum chamber containing the EUV illuminator, the mask stage, the EUV imaging sensor, and the projection optics box;

wherein the projection optics box includes:

a concave mirror having a central opening;

a convex mirror facing the concave mirror; and an aperture interposed between the concave mirror and the convex mirror, the aperture having an opening sized and positioned to pass EUV light reflecting from the EUV mask with a chief ray angle (CRA) of at least 8 degrees and to also pass EUV light reflecting from the convex mirror through the central opening of the concave mirror.

11. The EUV actinic mask review system of claim 10 wherein the projection optics box further includes:

a slider or carousel which carries a plurality of apertures, the slider or carousel arranged to insert a selected aperture of the plurality of apertures into an optical path of the projection optics box to set a numerical aperture of the projection optics box to a value determined by the selected aperture.

12. The EUV actinic mask review system of claim 11 wherein the slider or carousel is arranged to insert the selected aperture into the optical path of the EUV light after passing through the central opening of the concave mirror.

13. The EUV actinic mask review system of claim 11 wherein the slider or carousel is operable from outside of the vacuum chamber to insert the selected aperture into optical path of the projection optics box.

14. The EUV actinic mask review system of claim 10 wherein the slider of the EUV illuminator is operable from outside of the vacuum chamber to position the source-mask optimized illumination aperture of the plurality of EUV light shaping apertures such that the transmitted EUV light transmits through the source-mask optimized illumination aperture and then onto the associated EUV mask mounted on the mask stage.

15. The EUV actinic mask review system of claim 10 wherein the projection optics box includes:

a set of mirrors including the concave mirror and the convex mirror; and a set of actuators operable from outside of the vacuum chamber to adjust a position of at least one mirror of the set of mirrors.

16. The EUV actinic mask review system of claim 15 wherein the set of actuators includes:

actuators integrated into struts interconnecting the set of mirrors to adjust lengths of the struts.

17. An extreme ultraviolet (EUV) actinic mask review system comprising:

a mask stage configured to mount an associated EUV mask;

an EUV illuminator arranged to transmit EUV light onto the associated EUV mask mounted on the mask stage, the EUV illuminator including a slider carrying a plurality of EUV light shaping apertures, wherein one of the EUV light shaping apertures is a source-mask optimized illumination aperture for the associated EUV mask;

an EUV imaging sensor;

a projection optics box configured to project at least a portion of the EUV light reflected by the associated EUV mask mounted on the mask stage onto the EUV imaging sensor; and a vacuum chamber containing the EUV illuminator, the mask stage, the EUV imaging sensor, and the projection optics box.

18. The EUV actinic mask review system of claim 17 wherein the slider of the EUV illuminator is operable from outside of the vacuum chamber to position the source-mask optimized illumination aperture aperture of the plurality of EUV light shaping apertures such that the transmitted EUV light transmits through the source-mask optimized illumination aperture and then onto the associated EUV mask mounted on the mask stage.

19. The EUV actinic mask review system of claim 17 wherein the projection optics box includes:

a slider or carousel which carries a plurality of apertures, the slider or carousel operable from outside of the vacuum chamber to insert a selected aperture of the plurality of apertures into an optical path of the projection optics box to set a numerical aperture of the projection optics box to a value determined by the selected aperture.

20. The EUV actinic mask review system of claim 17 wherein the projection optics box includes:

a set of mirrors; and and a set of actuators operable from outside of the vacuum chamber to adjust positions of the mirrors of the set of mirrors.

* * * * *